United States Patent [19]

Teramoto et al.

[11] 3,740,617

[45] June 19, 1973

[54] SEMICONDUCTOR STRUCTURE AND METHOD OF MANUFACTURING SAME

[75] Inventors: Iwao Teramoto, Ibaragi-shi; Shinichi Nakashima, Suita-shi; Hitoo Iwasa, Takatsuki-shi; Yukio Miyai, Osaka, all of Japan

[73] Assignee: Matsushita Electronics Corporation, Osaka, Japan

[22] Filed: Nov. 13, 1969

[21] Appl. No.: 876,280

[30] Foreign Application Priority Data

Nov. 20, 1968 Japan ................................ 43/85703

[52] U.S. Cl.. 317/234 R, 317/234 A, 317/235 AK, 317/235 R

[51] Int. Cl. ............................ H011 3/00, H011 5/00

[58] Field of Search ....................... 317/234, 235, 1, 317/5, 5.4, 47.1; 331/107

[56] References Cited

UNITED STATES PATENTS

| | | | |
|---|---|---|---|
| 3,487,272 | 12/1969 | Siebertz et al. | 317/235 |
| 3,320,497 | 5/1967 | Neuf | 317/235 |
| 3,375,415 | 3/1968 | Finn | 317/235 |
| 3,389,457 | 6/1968 | Goldman et al. | 317/235 |
| 3,457,471 | 7/1969 | Moroney et al. | 317/235 |

OTHER PUBLICATIONS

Symposium on GaAs; Design Calculations for C W Millimetre Wane L. S. A. Oscillators by Riley, pages 173–179, given in October, 1968.

*Primary Examiner*—John W. Huckert
*Assistant Examiner*—Andrew J. James
*Attorney*—Stevens, Davis, Miller & Mosher

[57] ABSTRACT

A semiconductor structure and a method of manufacturing same wherein at least three mesa semiconductor units are formed in a regularly spaced relationship on a single substrate and a heat dissipator is attached to the mesa surface of each of the units, thereby stabilizing and ensuring the mounting of the heat dissipator as well as attaining a considerably improved heat dissipation property. The structure is useful for a large heat loss semiconductor such as a microwave generating avalanche diode.

1 Claim, 3 Drawing Figures

I. TERAMOTO,
S. NAKASHIMA,
H. IWASA AND
Y. MIYAI
INVENTORS

BY Stevens, Davis, Miller & Mosher ATTORNEYS

SEMICONDUCTOR STRUCTURE AND METHOD OF MANUFACTURING SAME

The present invention relates to semiconductor devices, and more particularly to having structures for semiconductor devices having improved heat dissipation, and to methods of manufacturing such structures.

In the operation of certain kinds of semiconductor devices such as an avalanche diode developed for use in a microwave generator, a reverse voltage must be applied to the *p-n*junction so that a high avalanche current may flow through the *p-n* junction, and therefore this must be accompanied by a large heat loss. In order to effectively operate such semiconductor devices, it is essential to dissipate the generated heat through a heat dissipator.

In most of the conventional mesa semiconductor structures, though a junction of a semiconductor device is near the surface of the device, a thermal conductor such as a copper plate is applied to the back surface of the device. Accordingly, they have disadvantageously a very poor efficiency from the viewpoint of heat transmission in that heat generated at the junction is conducted to the copper plate through the semiconductor device and then is dissipated. Meanwhile, the so-called "upside-down mounting principle" has been proposed and tried in which the surface of the mesa semiconductor structure where one or more mesa semiconductors are formed is attached to a heat dissipator, but such principle has rendered the fabrication of the device complicated and therefore has yielded low reproducibility due to the fact that the area of the mesa semiconductor surface of the structure is too small.

An object of the present invention is to provide a semiconductor structure with an improved heat dissipation property.

Another object is to provide a semiconductor structure in which a heat dissipator can be effectively fitted to semiconductor devices formed on a single substrate with ease.

Other objects and features of the present invention will become apparent from the following description referring to the accompanying drawings illustrating embodiments, in which.

Figure 1:
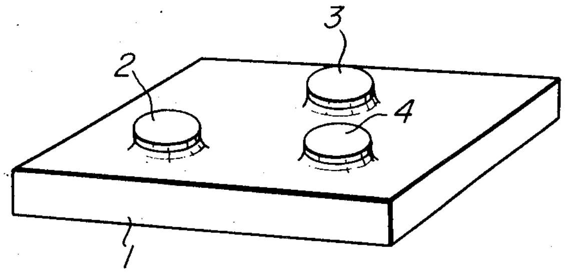
FIG. 1 is a perspective view showing a semicondoncutor arrangement according to an embodiment of the present invention.

Referring to FIG. 1 showing an example of the semiconductor arrangement according to the present invention, there are formed on a single semiconductor substrate 1 three mesa semiconductor units as indicated by 2, 3 and 4 regularly arranged. In the case of the illustration in FIG. 1, the three mesa semiconductor units are positioned so as to be at the apexes of a regular triangle on the substrate. In the manufacture of the device of FIG. 1, during the formation of the mesa semiconductor units, they are regularly arranged in the same unit area of the substrate and are subjected to the mesa etching treatment to complete the regular arrangement device.

Figure 2:
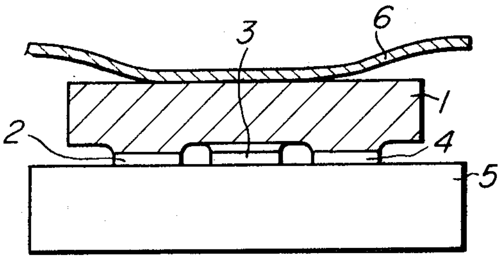
FIG. 2 is a cross-sectional view of a semiconductor structure according to an embodiment of the present invention, illustrating the manner of fabrication.

Referring to FIG. 2 showing in cross section an example of the semiconductor structure of the present invention, where like parts are denoted by the same reference numerals are used in FIG. 1, a regular arrangement semiconductor device such as is manufactured and described referring to FIG. 1 in accordance with the present invention is made to contact a heat dissipator 5 made of a thermally conductive material, for example, copper in a manner that the surface of each of the mesa semiconductor units 2, 3 and 4 formed on the substrate 1 abuts upon the dissipator 5. Since, in this structure, the semiconductor device including the mesa units is contacted with the heat dissipator at the three regular points, stable fabrication is ensured. Further, as the mesa units 2, 3 and 4 are provided with metal electrodes (not shown) at their surfaces, bonding between the semiconductor device including the mesa units 2, 3 and 4 and the heat dissipator 5 may be satisfactorily carried out either by the known thermo-compression bonding or by the known soldering, from the viewpoint of mechanical strength and thermal (and if necessary electrical) conductivity. By providing a strip-like or wire terminal 6 on the other surface of the substrate 5 where the mesa units are not formed, it is possible to effect electrical connection with external terminals.

The structure of the present invention is further advantageous in that due to the regularly spaced arrangement of a plurality of mesa semiconductor units on a single substrate, the heat dissipating property is considerably improved as compared with a semiconductor structure having a heat dissipating surface as large as the sum of the heat dissipating areas for the separate mesa units of the present structure. Further the electrical characteristics of the formed mesa semiconductor units can be made almost identical or compatible with one another thereby assuring normal operation of the mesa units on the single substrate. When the number of mesa units is three, the regular arrangement of the units is such that will define a regular triangle on the single substrate as mentioned above, so that by previously knowing the crystallographic orientation of the substrate, the directions of the sides of the regular triangle can be made to be parallel with the planes of cleavage of the substrate for the purpose of facilitating or ensuring the scribing process for dividing a semiconductor wafer into separate semiconductor units.

Figure 3:
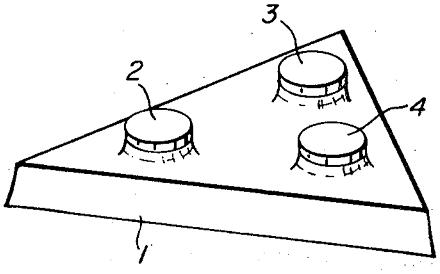
FIG. 3 is a perspective view showing a semiconductor arrangement on a substrate of a particular shape according to the present invention.

An example of the method of manufacturing the semiconductor structure in accordance with the present invention will now be described referring to FIG. 3 where like parts are denoted by the same reference numerals as were used in FIGS. 1 and 2.

A silicon substrate having an impurity concentration of $1 \times 10^{20}$ atoms/cm$^3$ was prepared. On the substrate, an n-type silicon epitaxial layer having a controlled impurity concentration of $1 \times 10^{17}$ atoms/cm$^3$ was grown to a thickness of about 10 $\mu$. Thereafter, a *p*-type diffusion layer was formed in the surface of the epitaxial layer to a depth of about 3 $\mu$ thereby forming a *p-n* junction. A circular photoresist mask having a diameter of about 100 $\mu$ was provided at each of the apexes of a regular triangle described on the diffusion layer on the substrate as having each side as long as about 200 $\mu$. One of the sides of the triangle was in a direction parallel to the <110> direction. Then, the substrate surface was mesa-etched to a depth of about 20 $\mu$ to form the three mesa units 2, 3 and 4. A metal layer was deposited on each of the mesa surfaces of the thus formed mesa units. Subsequently, triangular semiconductor units such as shown in FIG. 3 were separated along scribing lines drawn in <110> directions. A heat dissipator made, for example, of a copper plate was attached to the mesa surfaces through a soldering material, thereby completing a semiconductor structure. A voltage was applied to the thus manufactured semiconductor structure in a reverse direction so that an avalanche current of about 200 – 400 mA might flow. Thereby. stabilized microwave generation at a frequency of 6 – 14 GHz was attained. The output of the resulting semiconductor structure was about twice as large as that of a single mesa type semiconductor having a mesa area equal to the sum of those of the three mesa units.

As has been described above, in accordance with the present invention, at least three mesa semiconductor units are formed in a regularly spaced relation on a single substrate and a heat dissipator is attached to the mesa surface of each of the units which surface is near the junction of each unit. Accordingly, heat generated at the junction of each of the semiconductor units is effectively dissipated, and the heat dissipator is stably fixed to the semiconductor device or the substrate with the semiconductor units formed thereon, so that the reproducibility of the thermal and electrical characteristics is high.

We claim:

1. A semiconductor structure comprising a regular triangular substrate having a side scribed and cut along a <110> plane of cleavage of said substrate; three spaced mesa semiconductor units, each having a *p-n* junction, arranged on the surface of said regular triangular substrate to form the apexes of a regular triangle, the triangle defined by said three semiconductor units being arranged on the surface of said substrate with at least one of its sides parallel to said <110> plane of cleavage of said substrate; and a heat dissipator in contact with the surface of each of said three mesa units, the heat generated at the junction of each of said semiconductor units being effectively dissipated to assure good reproducibility of the thermal and electrical characteristics of said units and each of said semiconductor units being subjected to the same pressure by said heat dissipator.

* * * * *